United States Patent
Katoda

(10) Patent No.: US 7,476,628 B2
(45) Date of Patent: Jan. 13, 2009

(54) METAL OXIDE LAYER FORMED ON SUBSTRATES AND ITS FABRICATION METHODS

(75) Inventor: Takashi Katoda, 4804-83, Ikku, Kochi-shi, Kochi (JP) 780-8130

(73) Assignee: Takashi Katoda, Kochi (JP)

( * ) Notice: Subject to any disclaimer, the term of this patent is extended or adjusted under 35 U.S.C. 154(b) by 446 days.

(21) Appl. No.: 11/258,008

(22) Filed: Oct. 26, 2005

(65) Prior Publication Data
US 2006/0089006 A1 Apr. 27, 2006

(30) Foreign Application Priority Data
Oct. 26, 2004 (JP) .............................. 2004-310331

(51) Int. Cl.
*H01L 21/31* (2006.01)
(52) U.S. Cl. ........................................ 438/785; 438/758
(58) Field of Classification Search ................ 438/758, 438/785
See application file for complete search history.

(56) References Cited

U.S. PATENT DOCUMENTS

| 6,214,712 | B1 | 4/2001 | Norton |
| 2003/0146433 | A1 | 8/2003 | Cantwell et al. |
| 2004/0251457 | A1* | 12/2004 | Katoda ........................ 257/12 |

FOREIGN PATENT DOCUMENTS

| EP | 0 362 207 | 4/1990 |
| EP | 1 487 022 | 12/2004 |

OTHER PUBLICATIONS

European Search Report dated Nov. 7, 2006 for Application No. 05023406.1.
O.M. Hussain et al., *Characterization of Activated Reactive Evaporated MoO₃ Thin Films for Gas Sensor Applications*, Materials Chemistry and Physics, vol. 80, No. 6, Jun. 26, 2003, pp. 638-646.
S. Choopun, et al., *Orthohombic Molybdenum Trioxide Whiskers by Vapor Transport Method*, Japanese Journal of Applied Science, vol. 43, No. 1A/B, Jan. 15, 2004, pp. L91-L93.

* cited by examiner

*Primary Examiner*—Bradley K Smith
(74) *Attorney, Agent, or Firm*—Eric J. Robinson; Robinson Intellectual Property Law Office, P.C.

(57) ABSTRACT

The present invention is directed to a new semiconductor film comprising of metal oxide grown on a substrate and its fabrication method.

The metal oxide is comprised of molybdenum oxide which is very useful to fabricate electronic devices with high withstand voltages and photonic and electronic hostile-environment devices. An important aspect of the present invention is that the molybdenum oxide film is formed on a substrate made of material which has been used in usual electronic and photonic devices. The most popular material is silicon. Another important aspect of the present invention is a new method to form a molybdenum oxide film on a substrate.

8 Claims, 5 Drawing Sheets

METAL OXIDE LAYER FORMED ON SUBSTRATES AND ITS FABRICATION METHODS

BACKGROUND OF THE INVENTION

1. Field of the Invention

The present invention relates to new semiconductor films made of metal oxide with large bandgaps formed on substrates.

The new semiconductor films are very useful to be used in electronic and photonic devices.

The present invention relates to also a new method to form said new semiconductor films on substrates made of material which has been used in usual electronic and photonic devices.

2. Related Background Art

Recently so-called power devices such as bipolar transistors, field effect transistors, and thyristors are used in various fields such as domestic electronic articles, cars, machine tools, and illumination. With increase of application, conversion and control of electric power with high efficiency and with a high speed are requested to power devices. Although power devices have been fabricated using silicon (Si) for a long time, limits of silicon devices are predicted. The limits come from the fact that the bandgap of silicon, about 1 electron volt (eV), is small. Research to realize power devices made up of semiconductors with large bandgaps, that is, so-called widegap semiconductors to overcome the limits has been widely done. In particular, development of power devices using gallium nitride (GaN) whose bandgap is about 3.43 eV or silicon carbide (SiC) whose bandgap is about 3.2 eV has been done extensively.

On the other hand, error or trouble of electronic devices due to noise which comes from the cosmic rays or cars and heat has been serious problems. It has been made clear that so-called hostile-environment devices which are proof against a severe environment with noise or heat should be made of semiconductors with large bandgaps. Development of electronic devices using GaN or SiC has been done from these points. However there are many problems to be solved to realize electronic devices made of GaN or SiC.

The most serious problem is that bulk crystal of GaN has not been obtained because an equilibrium vapor pressure of nitorogen is very high relative to that of gallium. Therefore, substrates made up of sapphire or silicon carbide (SiC) are used. GaN can not be formed directly on a sapphire substrate because there is lattice mismatch of 16% between sapphire and GaN. Therefore a buffer layer of aluminum nitride (AlN) is formed on a sapphire substrate before growth of GaN. AlN is resistive because it is difficult to dope impurities into AlN. Use of sapphire substrate in a device which includes multi-layers of semiconductor such as a bipolar transistor and a thyristor is very disadvantageous to their structures and fabrication process. On the other hand, SiC substrate is very expensive because bulk crystal of SiC can be grown at a very high temperature of 2200~2400° C. GaN devices using SiC substrate or SiC devices are very expensive.

The second serious problem is to realize new devices which can be grown at a lower temperature than that at which GaN or SiC layers are formed. It is necessary to form layers of GaN or SiC at a temperature higher than 1000° C. Large energy is necessary to form semiconductor layers at a high temperature. In addition, there are possibilities that atoms move between layers and a composition is disturbed or dopants move near the interface between layers.

The problems described above can be solved by using molybdenum oxide for such devices. The inventor of the present invention discovered that high quality molybdenum oxide crystal has a large bandgap larger than 3.2 eV and is very useful to be used in photonic and electronic devices (U.S. patent application Ser. No. 10/848,145 and Ser. No. 10/863,288).

However, in the patent application described above, the molybdenum oxide crystal was formed by oxidation of a metallic molybdenum plate. Because the molybdenum plate was not crystal, some fabrication technologies such as cleavage could not used. In addition, it was impossible to integrate the devices formed of molybdenum oxide with those formed of silicon. Furthermore, precise control of a thickness of the molybdenum oxide layer was difficult when it was formed by oxidation of a molybdenum plate.

Therefore it is required to form a layer of semiconductor crystal whose bandgap is larger than 3.2 eV on a substrate made of material which is used in usual devices. The semiconductor layer should be formed at a relatively low temperature such that device structures are not damaged during the formation of the layer. Electronic devices with high withstand voltages and photonic and electronic hostile-environment devices will be made at a relatively low temperature on substrates which are used in devices at present.

SUMMARY OF THE INVENTION

The present invention is directed to a new semiconductor film comprising of metal oxide grown on a substrate and its fabrication method.

The metal oxide is comprised of molybdenum oxide which has a bandgap larger than 3.2 eV and is very useful to fabricate electronic devices with high withstand voltages and photonic and electronic hostile-environment devices. Molybdenum oxide is useful also to fabricate a light emitting diode or a laser diode which emit light with a wavelength shorter than 387 nm.

An important aspect of the present invention is that the molybdenum oxide film is formed on a substrate made of material which has been used in usual electronic and photonic devices. The most popular material is silicon.

Another important aspect of the present invention is to provide a new method to form a molybdenum oxide film on a substrate. This method comprises the following steps: A substrate and source material are set in a deposition chamber, at the first step. Typical source material is molybdenum plate and a typical substrate is silicon. A temperature profile is formed in the growth chamber such that a temperature at the source material is higher than that at the substrate at the second step. After the temperature profile is formed, oxygen gas is flowed for a period which depends on a thickness of the molybdenum oxide which is required to form a particular device at the third step.

DETAILED DESCRIPTION OF THE PREFERRED EMBODIMENTS

Reference will now be made in greater detail to preferred embodiments of the invention.

The First Embodiment

Figure 1:
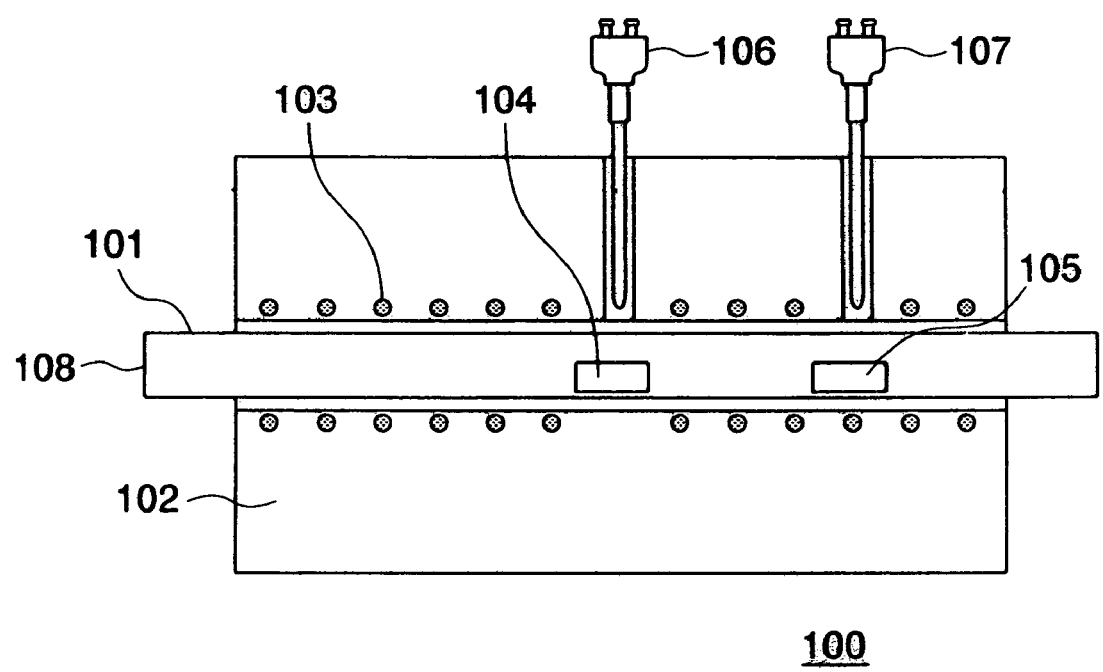
FIG. 1 is a schematic view of one example of an equipment to be used to form metal oxide layer according to the method of the present invention.

FIG. 1 shows schematically one example of an equipment to be used to form high-purity molybdenum oxide according to the method of the present invention. The equipment (100) to be used to form molybdenum oxide includes a quartz tube (101) in which molybdenum oxide is deposited, a source holder (104), a substrate holder (105), a furnace (102) and heaters (103) which can form a temperature profile in the furnace (102). A thermometer (106) which monitors a temperature of the source and a thermometer (107) which monitors a temperature of the substrate are also included. The thermometers (106) and (107) were thermo-couple in this case. Means to introduce and control oxygen gas (108) and nitrogen gas are included although they are not shown in the figure. Inside of the quartz tube (101) can be evacuated by a vacuum pump (not shown in the figure). The source holder (104) and the substrate holder (105) were made of quartz because it does not change at a temperature at which molybdenum oxide is formed and does not react with a substrate, oxygen and molybdenum oxide. Although the equipment shown in FIG. 1 was used in a typical embodiment, it is not restricted as far as a preferred temperature profile is formed including source and substrate zones and inside of the deposition chamber can be made oxygen atmosphere.

Figure 2:
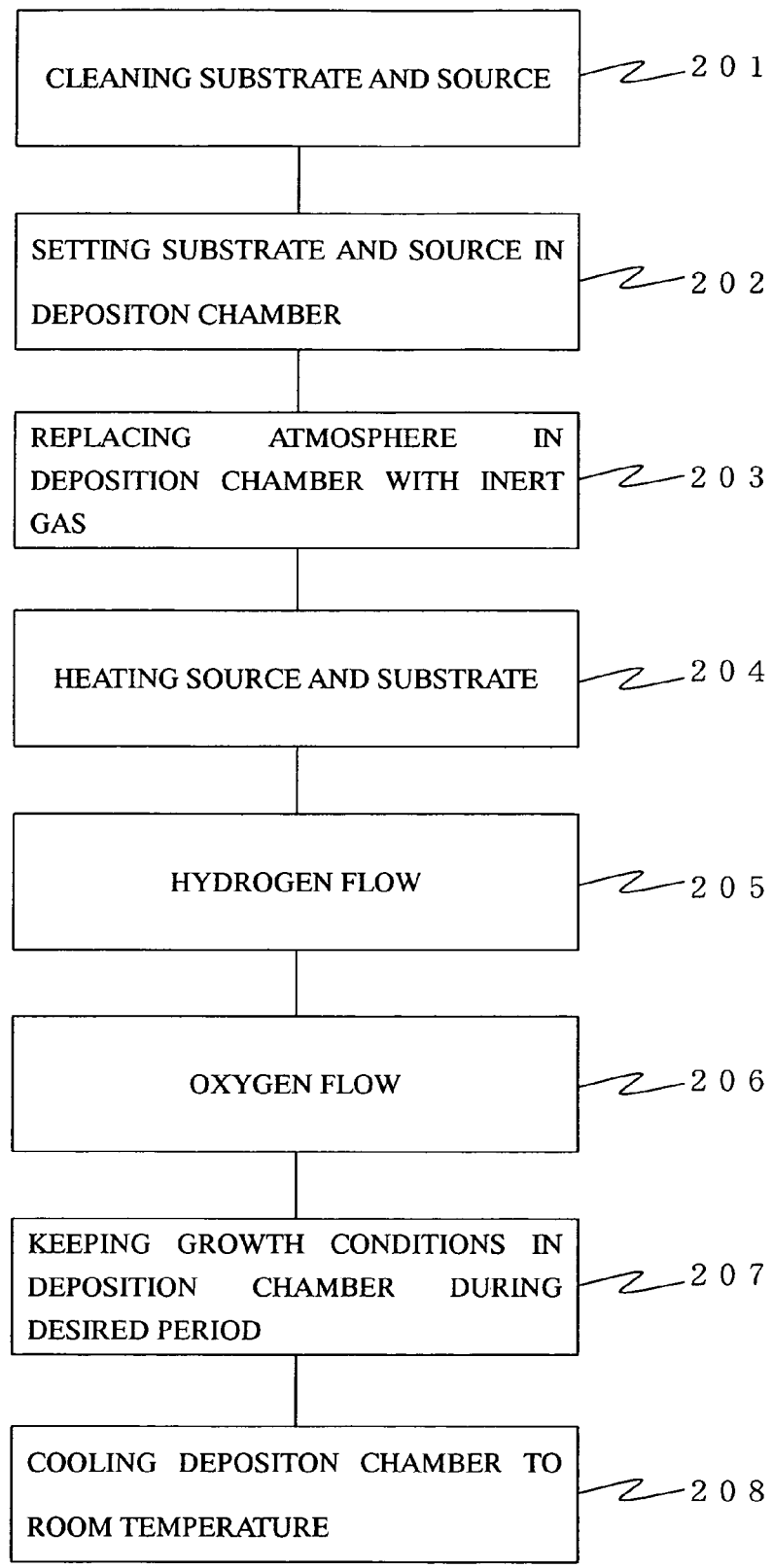
FIG. 2 is a flow diagram which shows steps to form metal oxide layer by deposition on a substrate according to the present invention.

The new method to form molybdenum oxide according to the present invention will be described with reference to the flow diagram shown in FIG. 2. A molybdenum (Mo) plate was used as source and a silicon (Si) substrate were used in this example. At first, the molybdenum plate and the silicon substrate were rinsed with acetone, methanol and high-purity water in this sequence (step 201). A molybdenum plate is rinsed with sulfuric acid and high-purity water following to the step 201 if necessary. Naturally grown oxide on a silicon substrate is removed with hydrofluoric acid or other methods with hydrogen or hydrogen radical if necessary.

At the next step (step 202), a pre-treated source molybdenum plate or a molybdenum plate whose surface had been oxidized previously (10 mm×10 mm×0.1 mm) was set on the source holder (104) and a silicon substrate (10 mm×10 mm×0.1 mm) was set on the substrate holder (105) which was set at a position 20 cm apart from the source holder (104) to the downstream.

As the next step (step 203), inside of the quartz tube was evacuated to $10^{-3}$ Torr with a rotary pump and was filled with nitrogen (or inert gas such as argon).

Figure 3:
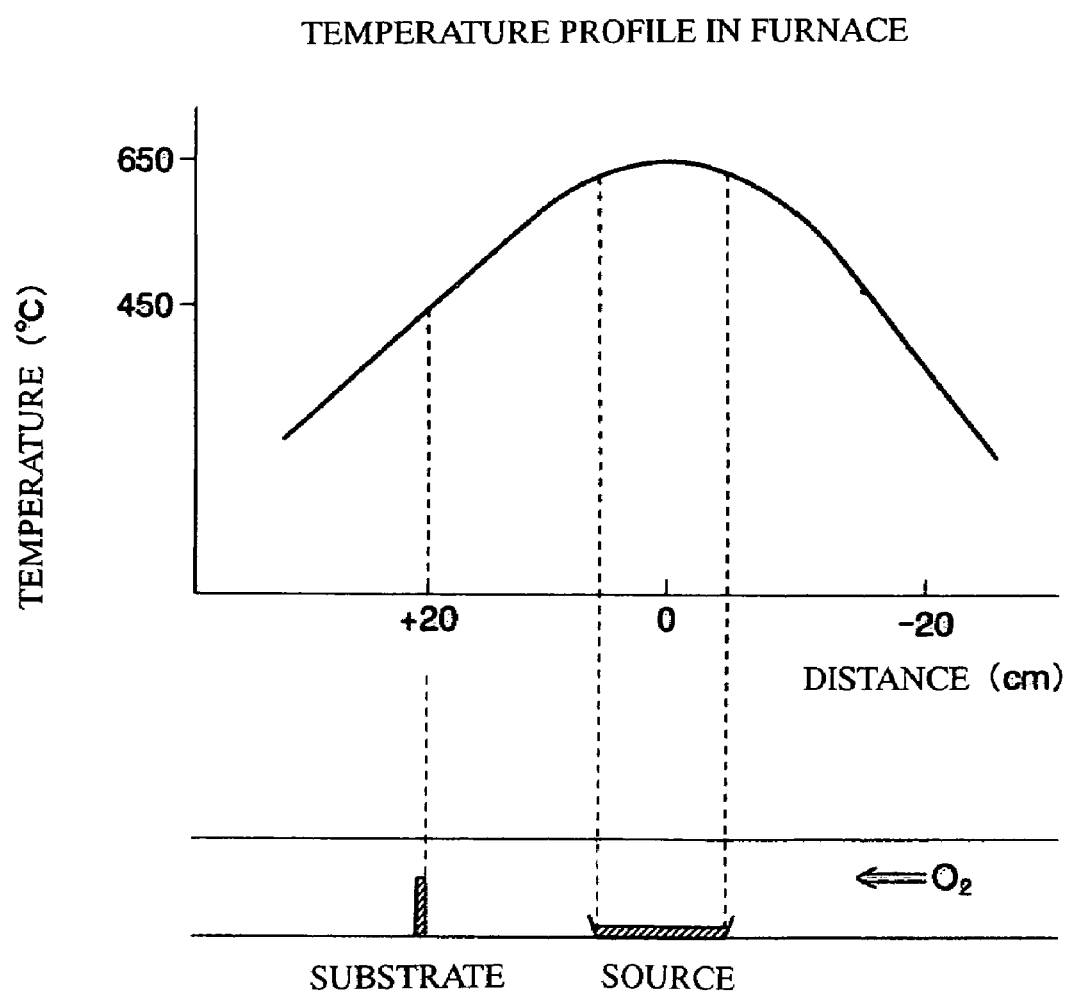
FIG. 3 shows one example of the temperature profile in a furnace and a position of a substrate during formation of a metal oxide layer by the method according to the present invention.
Figure 4:
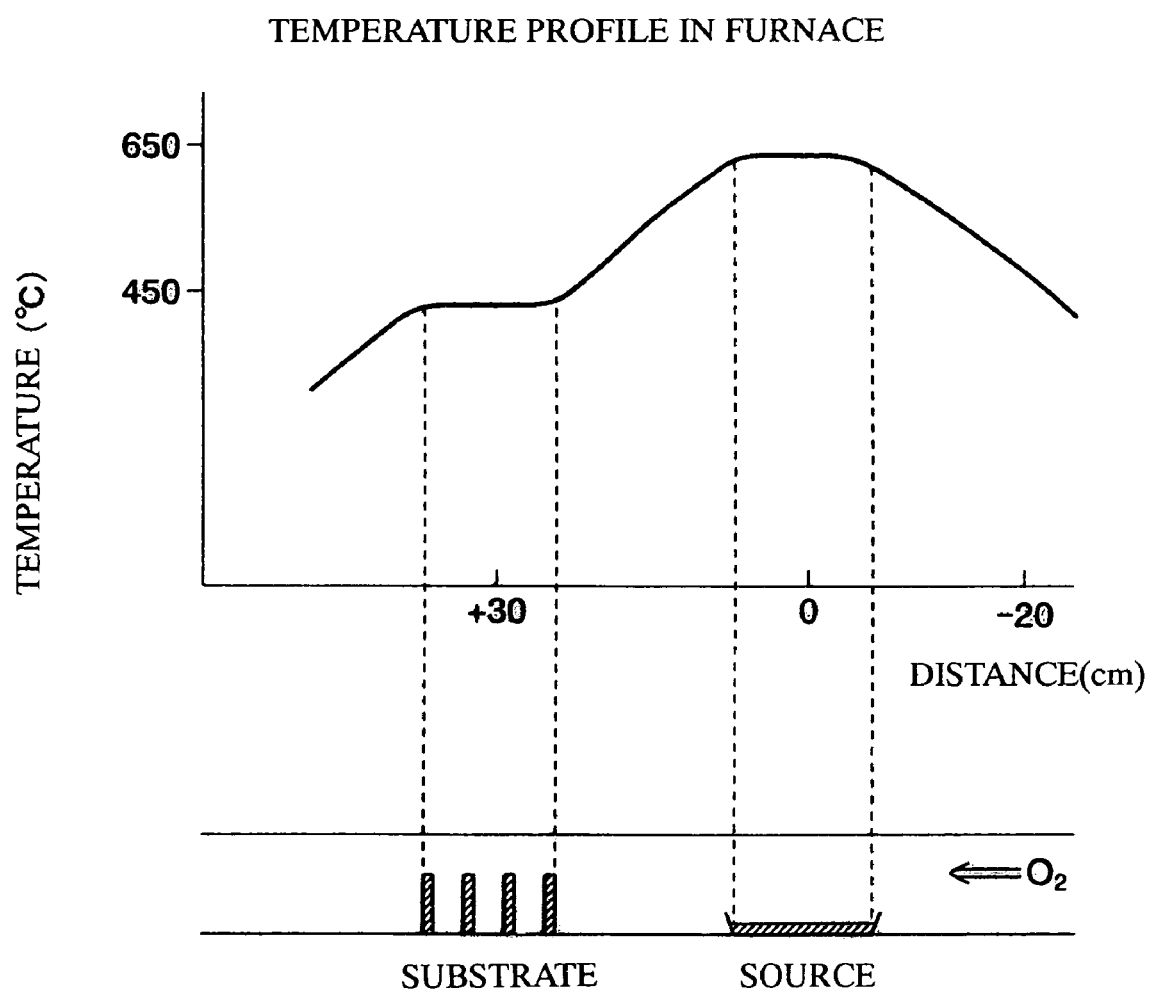
FIG. 4 shows one example of the more preferable temperature profile in a furnace in an area of a target substrate.

After air inside of the quartz tube was replaced with nitrogen or inert gas, the furnace was heated so that a temperature profile shown in FIG. 3 is formed (step 204). In the temperature profile, a temperature at the source zone was 650° C. and that at the substrate zone was 450° C. The temperature profile was formed by heating for about 45 minutes under control of a temperature controller (not shown in the figure). In embodiments of the present invention, a temperature of the source zone was 550~850° C., preferably 650° C. and that of the substrate zone was 350~650° C., preferably 450° C. A slope of temperature was formed from the source zone to the substrate zone. A temperature over 850° C. at the source zone was not preferable because oxygen is likely to leave molybdenum oxide and molybdenum nitride is likely to be formed. It is important that the temperature at the substrate zone is lower than that at the source zone.

After the desired temperature profile was formed in the furnace (102), oxygen gas (108) was introduced into the quartz tube (101) (step 206). The oxygen gas (108) flowed in a direction from the source holder (104) to the substrate holder (105). A flow rate of the oxygen gas (108) was 50 to 450 SCCM, preferably 250 SCCM. Although oxygen flow was used to make inside of the quartz tube to be oxygen atmosphere, other oxygen atmosphere, oxygen radical or oxygen plasma can be used as far as the molybdenum plate is oxidized at a desired temperature and molecules of molybdenum oxide desorb the source.

Figure 5:
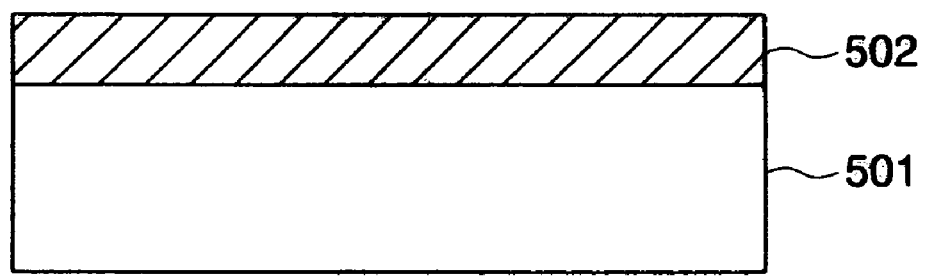
FIG. 5 is a schematic view of the metal oxide layer formed on a substrate made of material which is used in usual devices at present.

The temperature profile shown above and oxygen flow were kept for six hours (step 207). After then the furnace was cooled to room temperature keeping oxygen flow (step 208). As a result a layer of high quality single crystalline molybdenum oxide was deposited on a silicon substrate to a thickness of 6 μm as shown in FIG. 5. Although a growth rate of the molybdenum oxide was about 1 μm/h in the embodiment, it can be changed by selecting a size of the molybdenum source, a flow rate of oxygen and temperature profile. In addition, deposition rate depends also on many factors such as a diameter of the quartz tube, a distance between the source and the substrate and a size of the substrate. Therefore it is desirable to measure a growth rate previously for some sets of growth parameters. A thickness of the layer can be measured with optical methods or direct measurement.

The Second Embodiment

Strictly speaking, a thin layer of silicon oxide is likely to be formed between a silicon substrate (501) and a layer of molybdenum oxide (502). This is because the surface of the silicon substrate is oxidized at the early stage of growth of molybdenum oxide. If it is desired that the silicon oxide is not formed, growth of silicon oxide is prohibited by adding a step (step 205) to flow hydrogen for 5 minutes between the steps (204) and (206) in the flow diagram shown in FIG. 2 (other steps are similar to those shown above for the first embodiment). Although growth of silicon oxide was prevented by flowing hydrogen gas in the second embodiment, it can be prevented by other methods using reduction agents.

A temperature profile in a furnace as shown in FIG. 3 is simple one. However it is preferred that a temperature in the substrate zone is flat because more substrates can be set at the same temperature.

In the embodiments of the present invention, silicon substrates with various surface orientations such as (100) and (111) were used. High quality crystalline layers of molybdenum oxide could be formed on any such substrates. The method to deposit high quality films of metal oxide according to the present invention can be applied to form high quality metal oxide films on substrate other than silicon such as germanium, gallium arsenide, indium phosphide, gallium phoshpide, gallium nitride, silicon carbide, organic semiconductors or their derivatives, plastic substrates, polyimide and insulators such as glass. Similarly, the method of the present invention can be applied to form metal oxide films using metals such as zinc, titanium, tantalum, aluminum, ruthenium, indium, tin, iridium, palladium, tungsten, copper and chromium as their sources. It was shown by analysis using X-ray and Raman spectroscopy that molybdenum oxide films formed by the method according to the present invention have superior quality of crystal and more uniform composition relative to those formed by known methods CVD or sputtering. The reason is considered that molecules of molybdenum oxide desorb the source molybdenum plate without breaking their chemical bonds and molybdenum oxide deposits in a quartz tube which is kept at a relatively lower temperature. It was made clear from analysis using X-ray and Raman spectroscopy that the main composition of the molybdenum oxide film formed by the present method is $MoO_3$. It is known that the crystal structure of $MoO_3$ has different lattice constants depending on a direction of lattice. The fact is considered to be favorable to lessen problems due to difference of lattice constants when molybdenum oxide is deposited on a substrate of different material. A bandgap of molybdenum oxide formed by the present method was characterized larger than about 3.2 eV from reflection spectra measurement. It is possible to make molybdenum oxide having a bandgap larger than 3.2 eV by changing growth conditions such as a source temperature, a substrate temperature and a flow rate of oxygen, pre-treatment process of a source plate or a substrate or pre-treatment of a growth chamber. The fact that molybdenum oxide has a bandgap larger than 3.2 eV means that the material has possibility that it is possible to be used in devices instead of GaN or SiC. The molybdenum oxide formed by the present method was n-type and resistivities were $1.5 \times 10^7$ $\Omega \cdot cm$ and $2.0 \times 10^5$ $\Omega \cdot cm$ when the source temperatures were 650 and 750° C., respectively.

The molybdenum oxide made by the method according to the present invention can be used in usual ways in which other semiconductor materials are used in semiconductor industry. The molybdenum oxide made by the present method is high resistive when it is made without intentional doping and the source temperature is lower than 650° C. It is possible, however, to change electronic properties of the molybdenum oxide by doping donors (for example, P, As, Sb, Se et al.) or acceptors (for example, Zn, Ga, Mg et al.). When the molybdenum oxide is formed by the present method without intentional doping, it is possible to change its resistivity by changing the source temperature. For example, the resistivity of the molybdenum oxide grown by setting the source temperature at 750° C. is much less than that of the molybdenum oxide by setting the source temperature at 650° C. The reason is considered that oxygen vacancies in the molybdenum oxide have a role of donors and its concentration in the molybdenum oxide formed by setting the source temperature at a higher one is larger than that in the oxide formed by setting the source temperature at a lower one. The fact is remarkable point of the present method. In addition, it is possible to control local electronic properties of the molybdenum oxide formed by the present method, by introducing donors or acceptors in the local area by, for example, ion implantation.

Metal oxide films with a high resistivity formed by the method according to the present invention with, for example, setting the source temperature at a lower temperature can be used to separate devices on a substrate. Furthermore the method to form metal oxide films according to the present invention can be used to form such metal oxide films to be used as insulators in devices at present.

What is claimed is:

1. A method for making a semiconductor layer, said method comprising the steps of:
   providing a source metal plate and a substrate;
   cleaning the surfaces of said source metal plate and said substrate;
   setting said source metal plate and said substrate in a deposition chamber;
   heating said source metal plate to a source temperature between 500° C. and 850° C. and said substrate to a substrate temperature between 350° C. and 650° C. in an atmosphere of inert gas, wherein said source temperature is higher than said substrate temperature; and
   forming a metal oxide layer on said substrate by changing said atmosphere from inert gas to oxidizing atmosphere and maintaining said source and substrate temperatures in said deposition chamber for a period enough to form said metal oxide layer with a desired thickness.

2. A method to make a semiconductor layer, said method comprising the steps of;
   providing a substrate and a source metal plate whose surface has been oxidized in advance,
   cleaning the surfaces of said substrate and said source metal plate whose surface has been oxidized in advance,
   setting said substrate and said source metal plate in a deposition chamber,
   heating said source metal plate whose surface has been oxidized in advance, to a source temperature between 500° C. and 850° C. and said substrate to a substrate temperature between 350° C. and 650° C. in an atmosphere of inert gas, wherein said source temperature is higher than said substrate temperature; and
   forming a metal oxide layer on said substrate by changing said atmosphere from inert gas to oxidizing atmosphere and maintaining said source and substrate temperatures in said growth chamber for a period enough to form said metal oxide layer with a desired thickness.

3. The method according to claim 1,
   wherein said oxidizing atmosphere is provided by a flow of oxygen gas flowing in said deposition chamber in the direction from said source metal plate to said substrate in a flow rate of 50-450 SCCM.

4. The method according to claim 1 or 2, further comprising a step of flowing hydrogen for a desired period after said step of heating said source metal plate and said substrate and before said step of forming said metal oxide layer.

5. The method according to claim 1 or 2,
   wherein said substrate is made of silicon, gallium arsenide, gallium phosphide, indium phosphide, gallium nitride, silicon carbide, organic semiconductor or its derivatives or glass, and said source metal plate is made of molybdenum, molybdenum oxide or its derivatives.

6. The method according to claim 1 or 2,
   wherein said step of forming said metal oxide layer includes a step of doping donors or acceptors at the same time.

7. A semiconductor layer made by the method according to claim 1 or 2.

8. Deposition equipment for practicing said method for making a semiconductor layer according to claim 1 or 2, said deposition equipment comprising:
   a deposition chamber whose atmosphere can be changed with different gases;
   a source holder and a substrate holder which is set near said source holder;
   means for heating said source holder and said substrate holder so as to individually control the temperatures of respective areas where said source holder and said substrate holder are set; and
   means for introducing a flow of oxygen gas into said deposition chamber in the direction from said source holder to said substrate holder.

* * * * *